United States Patent [19]

Schweitzer, III

[11] Patent Number: 5,160,926
[45] Date of Patent: Nov. 3, 1992

[54] DISPLAY TRANSDUCER APPARATUS

[75] Inventor: Edmund O. Schweitzer, III, Whitman County, Wash.

[73] Assignee: Schweitzer Engineering Laboratories, Inc., Pullman, Wash.

[21] Appl. No.: 682,395

[22] Filed: Apr. 4, 1991

Related U.S. Application Data

[63] Continuation of Ser. No. 373,040, Jun. 28, 1989, abandoned.

[51] Int. Cl.[5] .............................................. G01R 31/08
[52] U.S. Cl. ...................... 340/870.02; 340/870.16; 340/538; 340/657; 340/870.11; 324/115; 324/512; 364/483
[58] Field of Search .......... 340/310 R, 310 A, 870.02, 340/870.09, 870.11, 870.16, 538, 644, 657, 825.15, 825.17, 825.18; 324/103 R, 114, 115, 512; 361/65, 67, 68, 76, 85; 364/483, 492; 307/48

[56] References Cited

U.S. PATENT DOCUMENTS

| | | | |
|---|---|---|---|
| 3,778,801 | 12/1973 | Nudelmont | 324/512 X |
| 4,077,061 | 2/1978 | Johnston et al. | 364/492 X |
| 4,420,805 | 12/1983 | Yamaura et al. | 364/483 X |
| 4,581,705 | 4/1986 | Gilker et al. | 364/483 X |
| 4,608,648 | 8/1986 | Oogaki | 364/483 |
| 4,689,570 | 8/1987 | Ohgaki et al. | 340/644 X |
| 4,788,619 | 11/1988 | Ott et al. | 364/483 X |
| 4,789,824 | 12/1988 | Henkelmann | 364/483 X |
| 4,801,937 | 1/1989 | Fernandes | 340/870.16 |
| 4,862,142 | 8/1989 | Knight | 340/657 X |
| 4,868,704 | 9/1989 | Cavero | 364/483 X |

FOREIGN PATENT DOCUMENTS 8303011 9/1983 World Int. Prop. O. .......... 364/483

Primary Examiner—Donald J. Yusko
Assistant Examiner—Michael Horabik
Attorney, Agent, or Firm—Heller, Ehrman, White & McAuliffe

[57] ABSTRACT

A display transducer adapter for obtaining and displaying power system information from a protective relay. The information includes watt, voltage, current, reactive power, and fault location information. The information may be converted from a digitized format into analog signals and those signals may be provided as outputs, the functions of which are user selectable. The user may also selectively scale the outputs to cover a specified range.

16 Claims, 15 Drawing Sheets

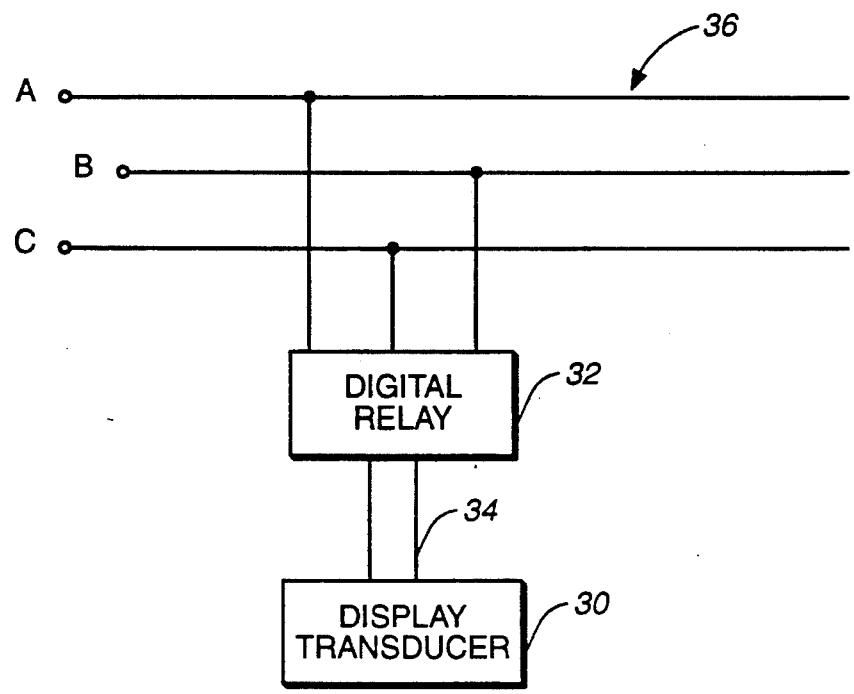
FIG._1
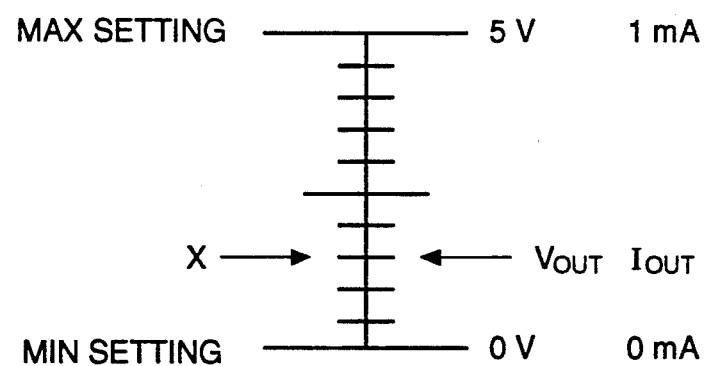
FIG._3

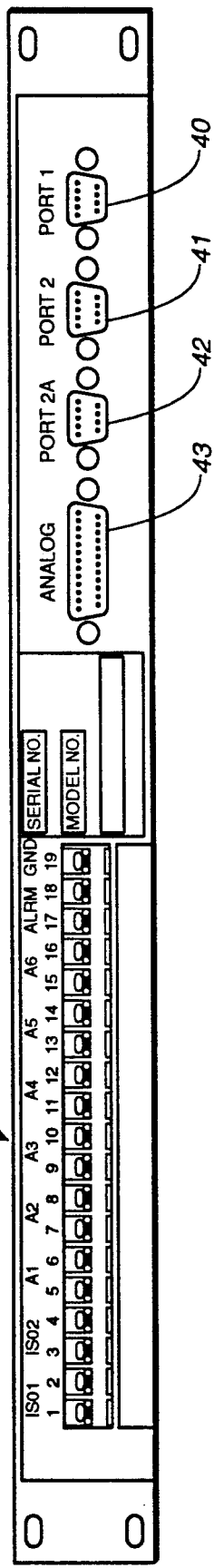
FIG._2
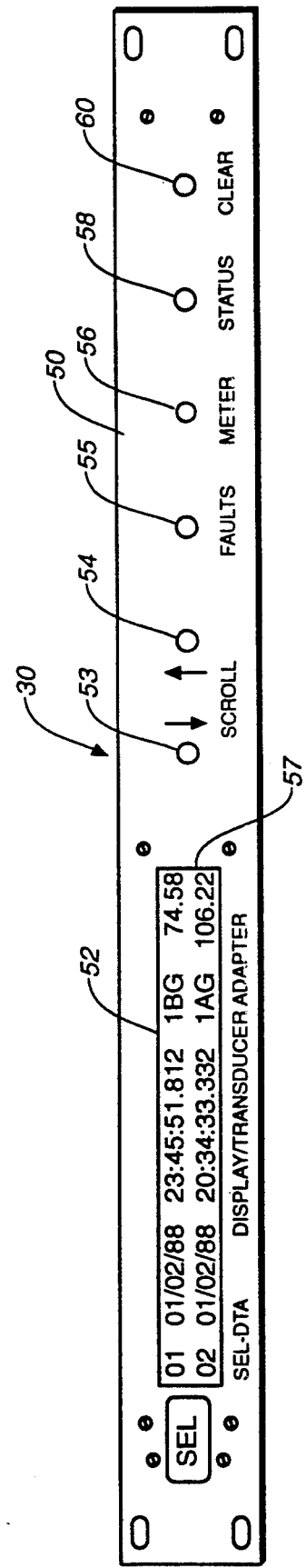
FIG._5

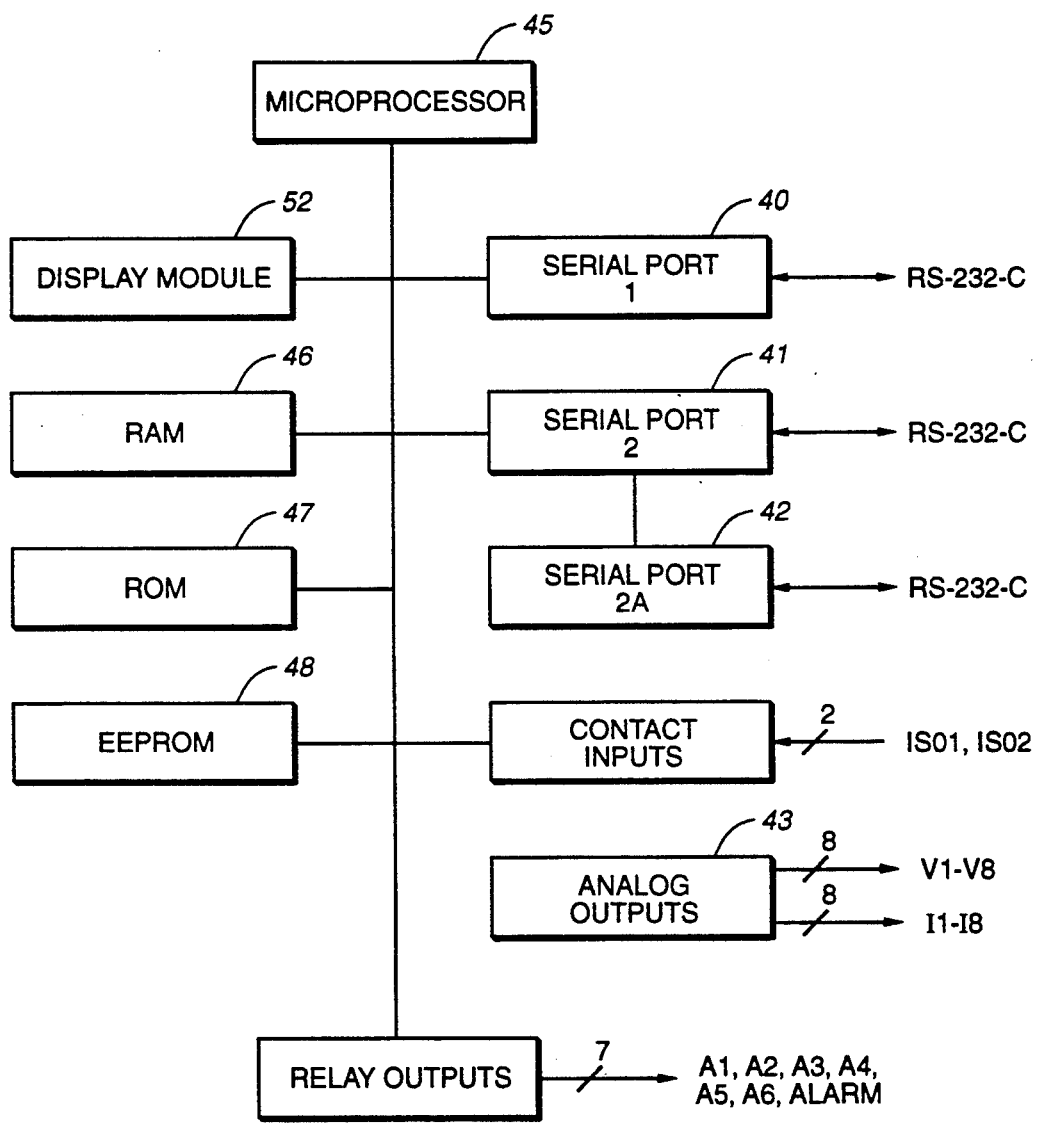
FIG._4

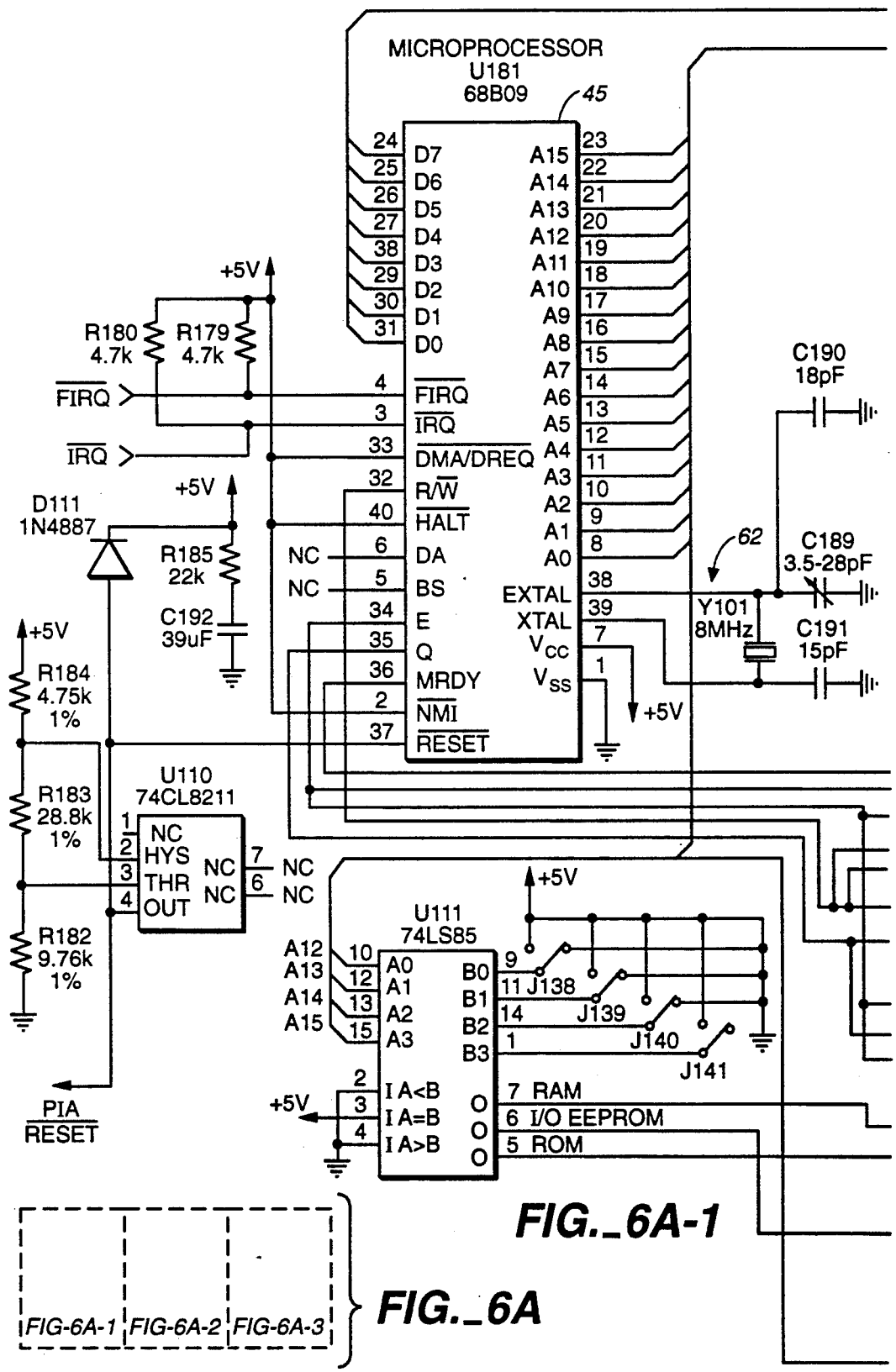
FIG._6A-1
FIG._6A

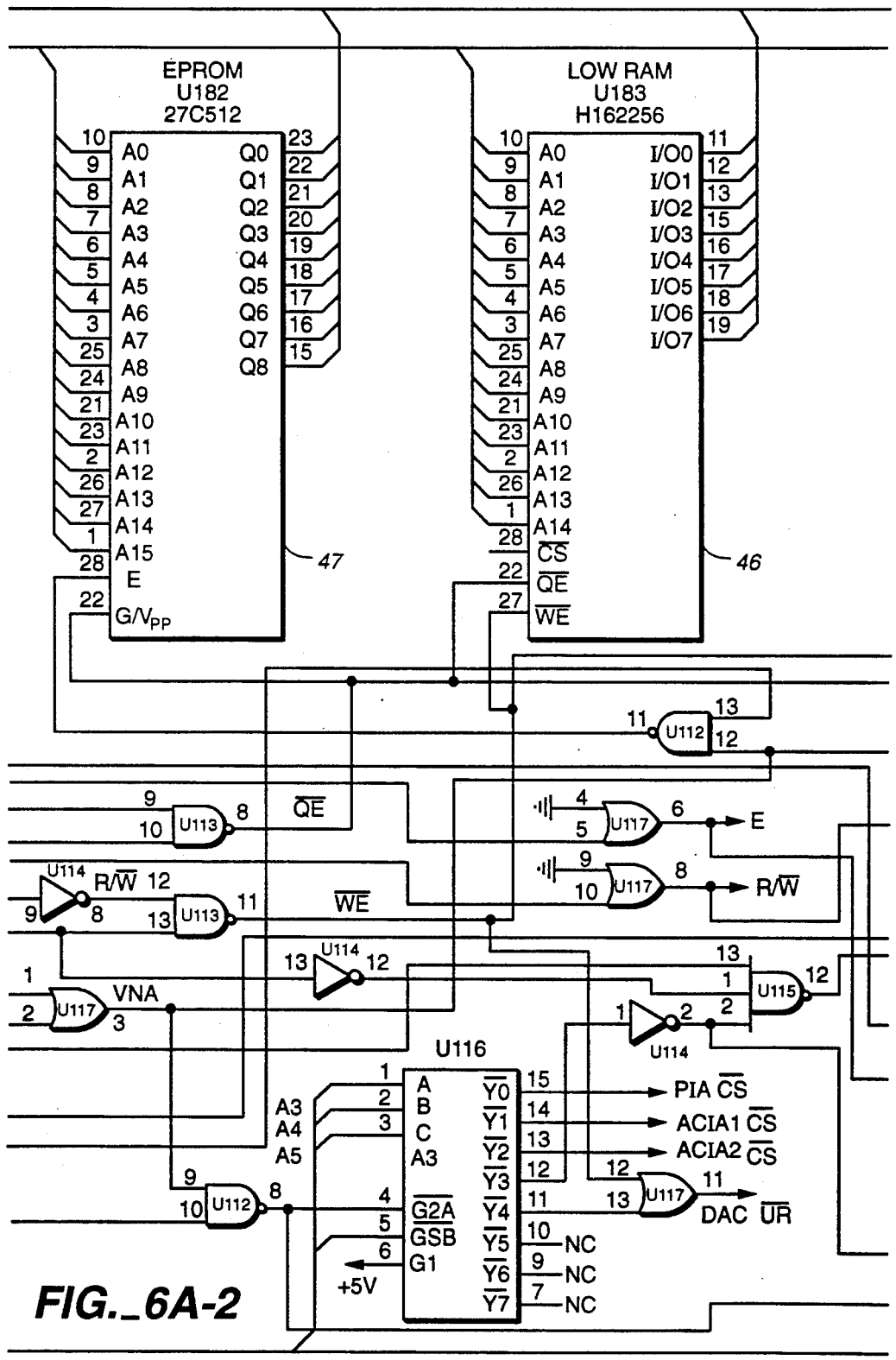
FIG._6A-2

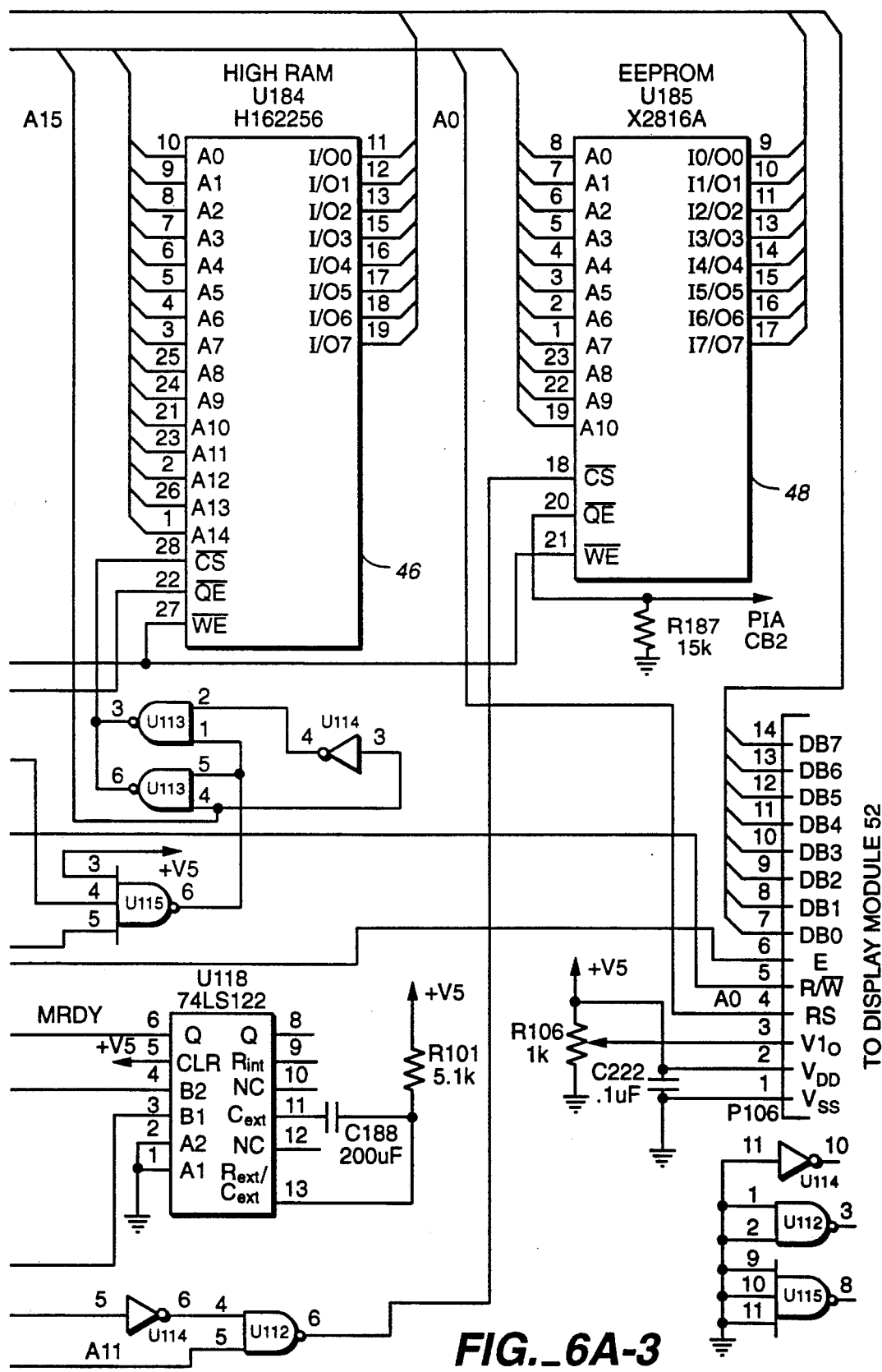
FIG._6A-3

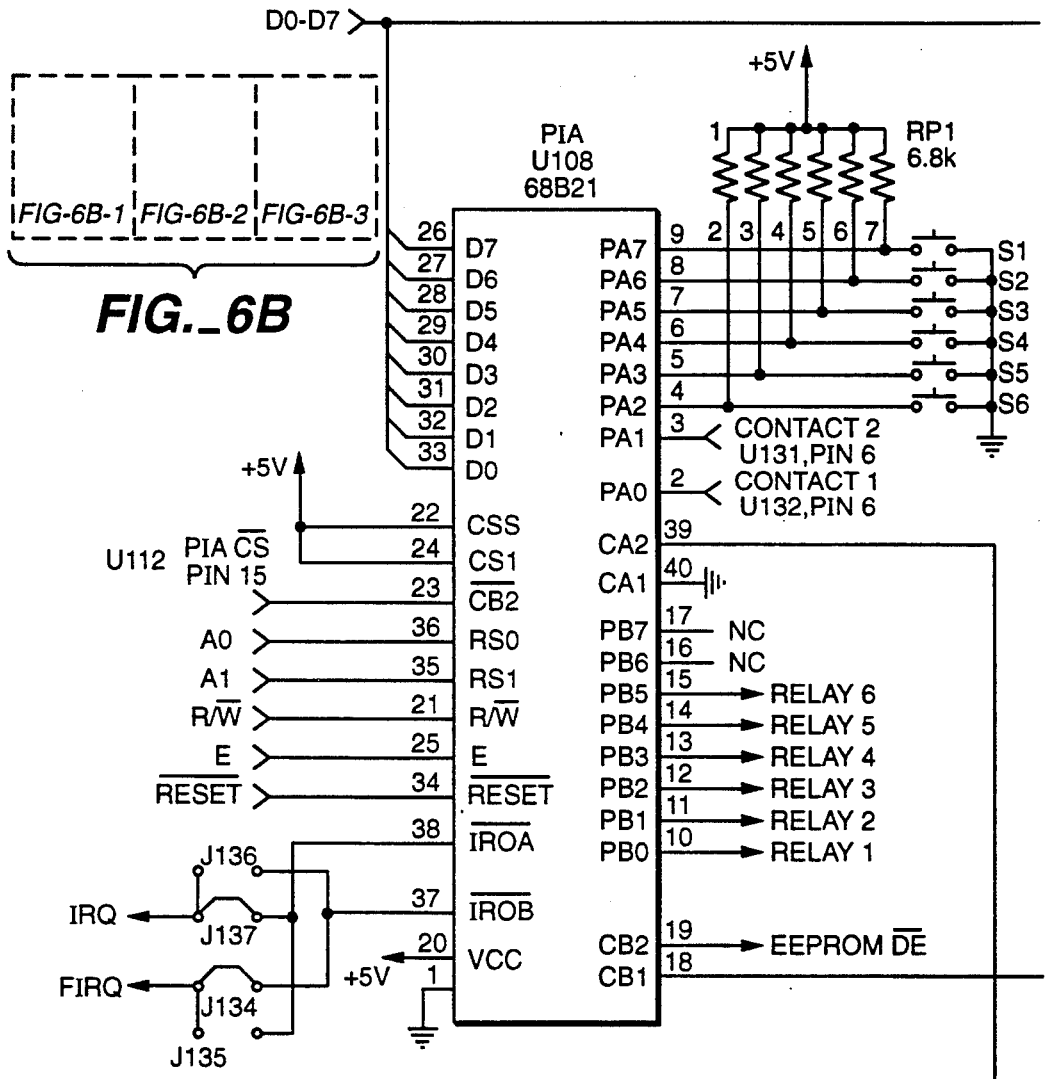
FIG._6B
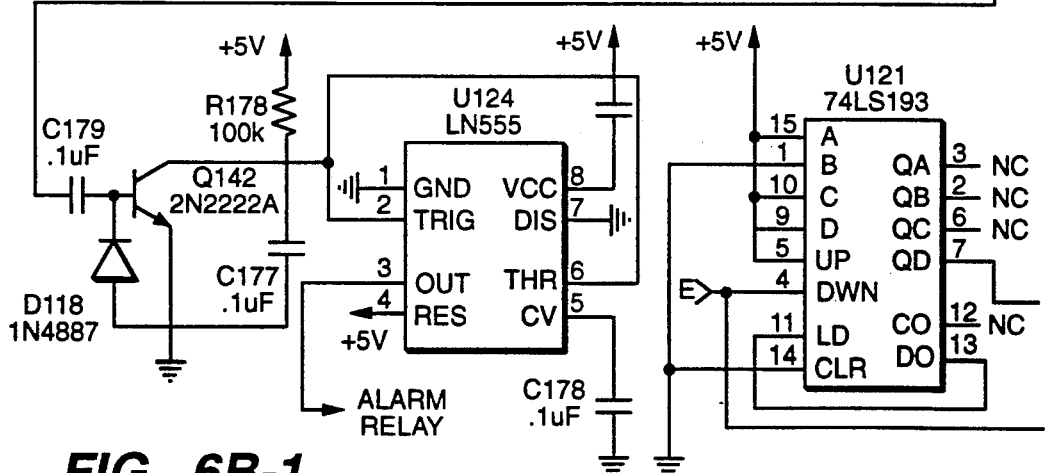
FIG._6B-1

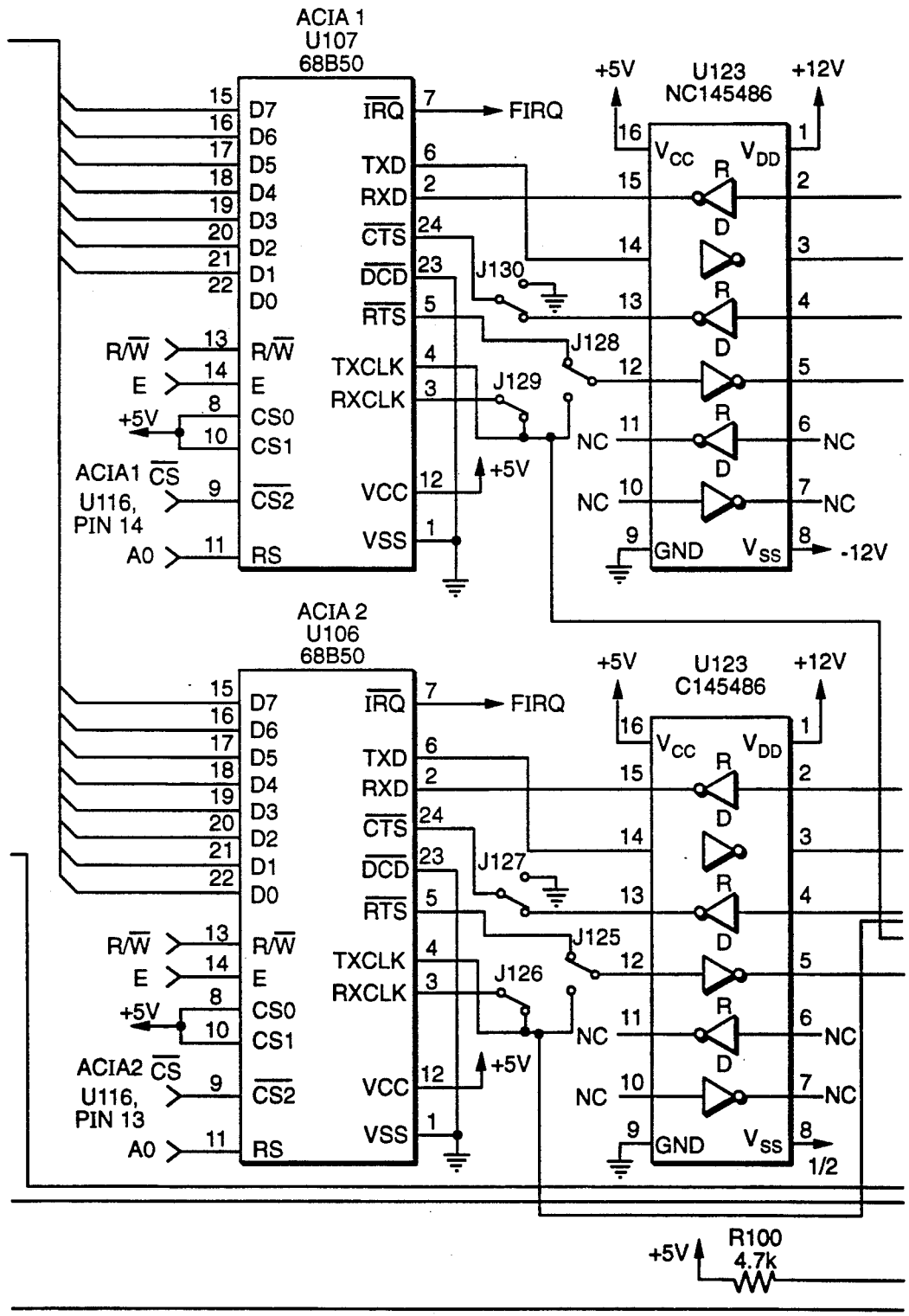
FIG._6B-2

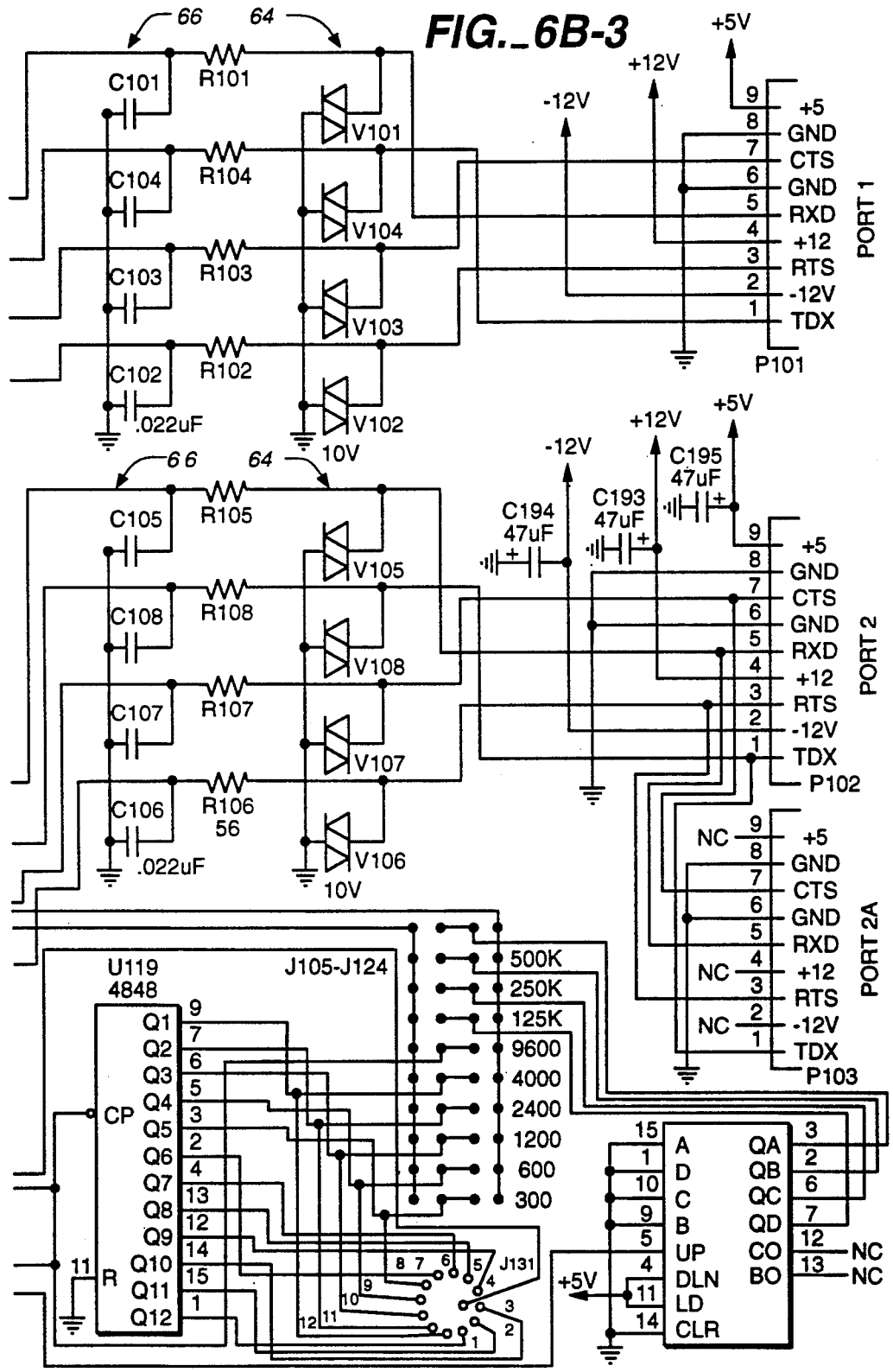
FIG._6B-3

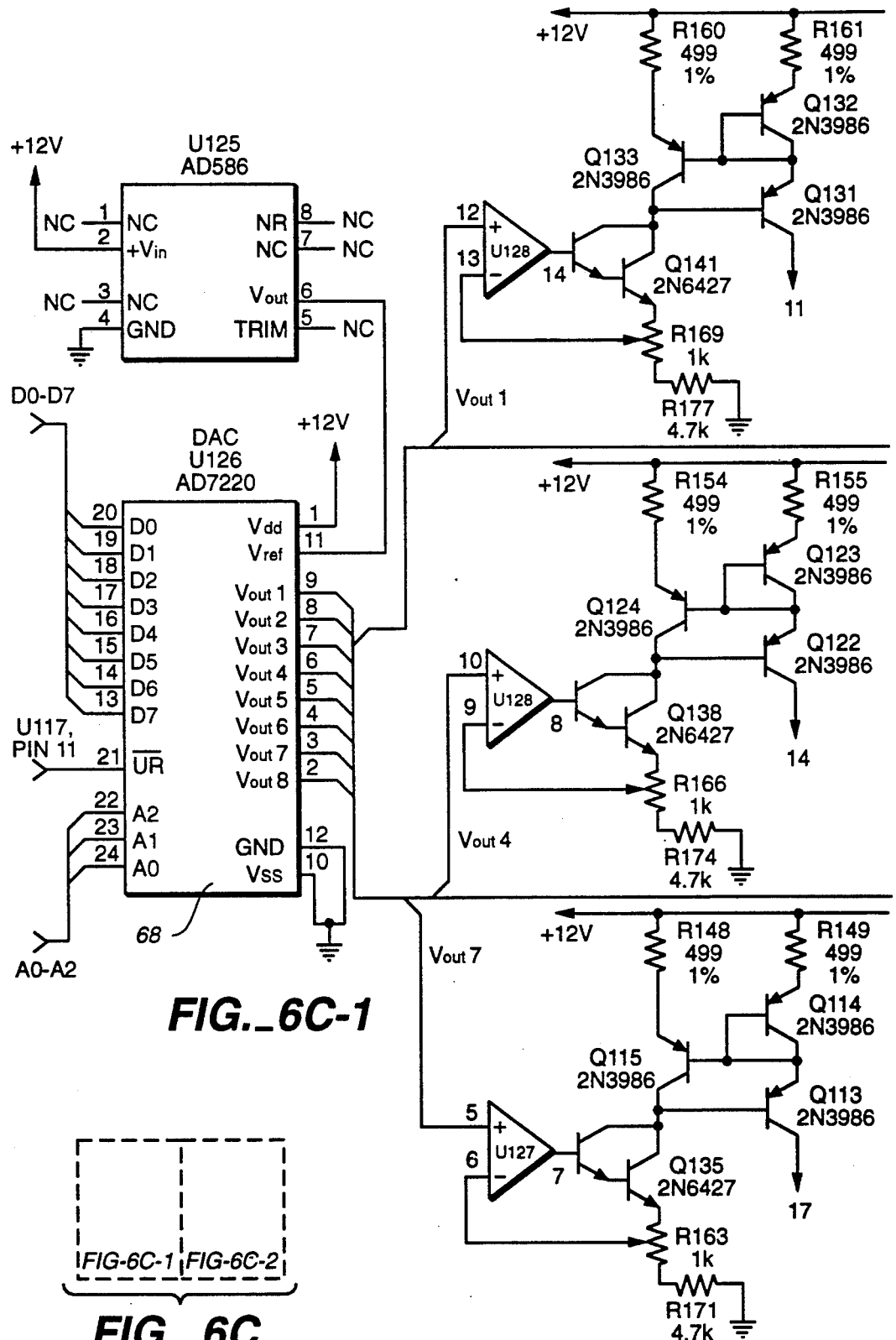
FIG._6C-1
FIG._6C

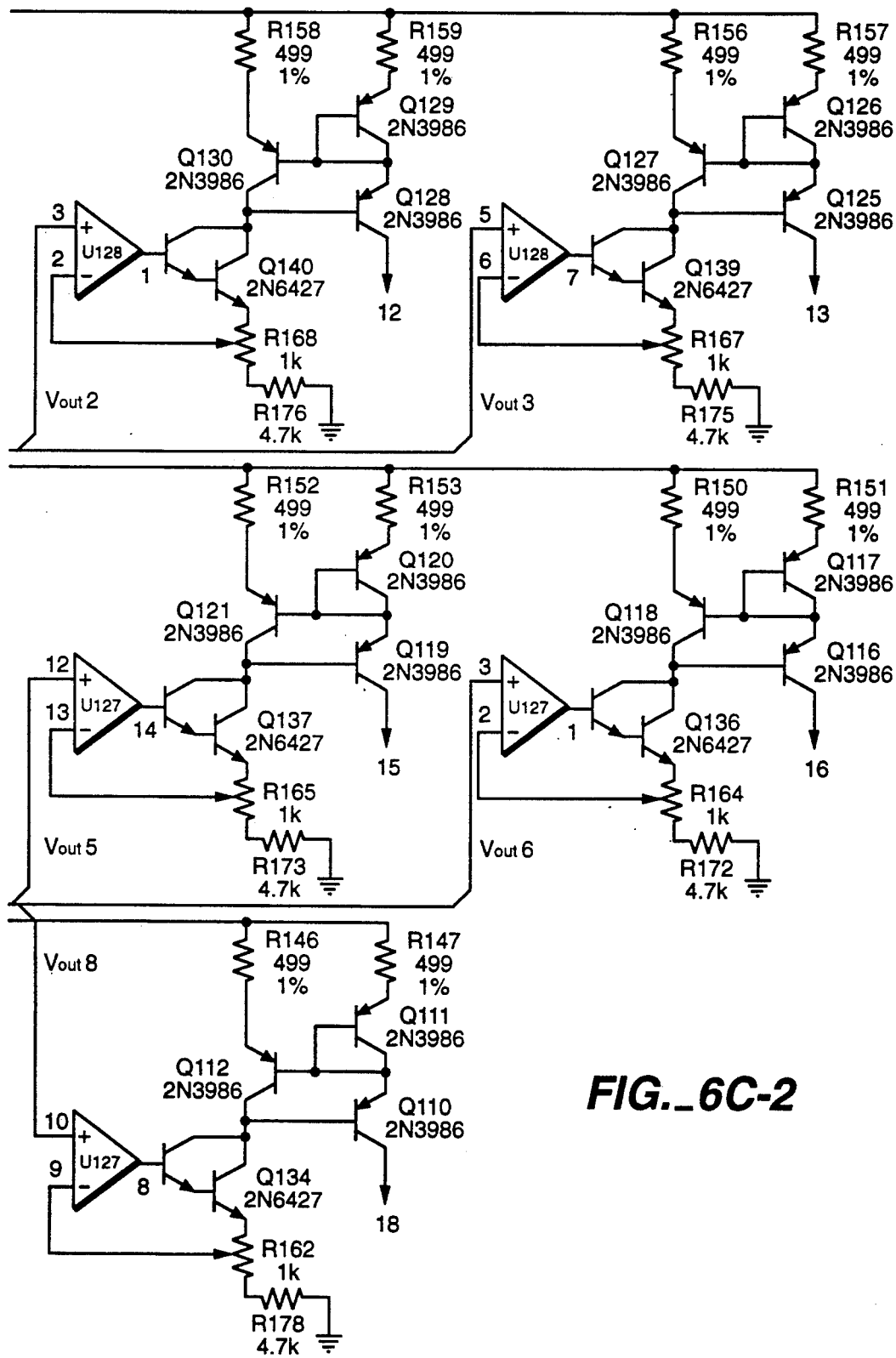
FIG._6C-2

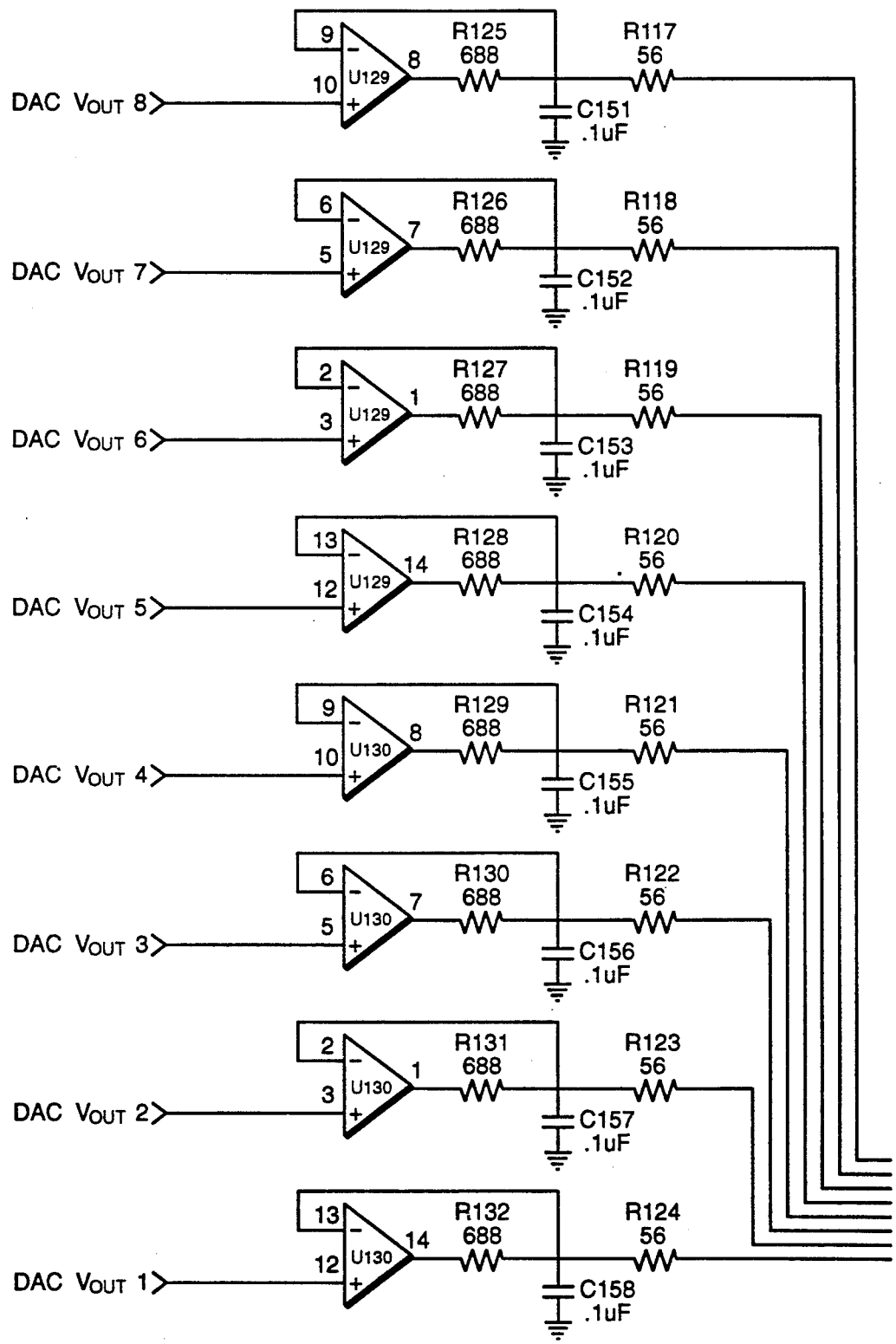
FIG._6D-1

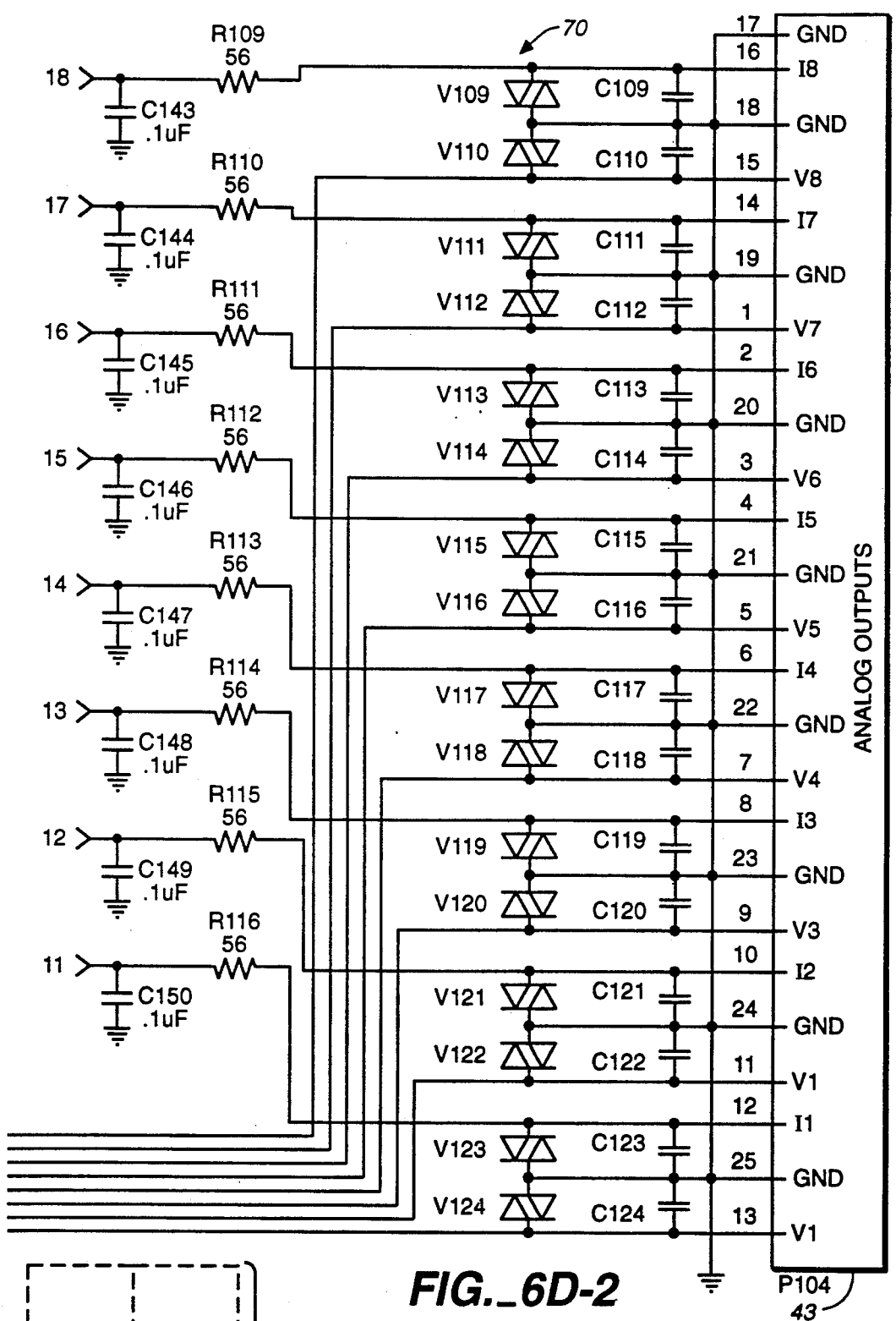
FIG._6D-2
FIG._6D

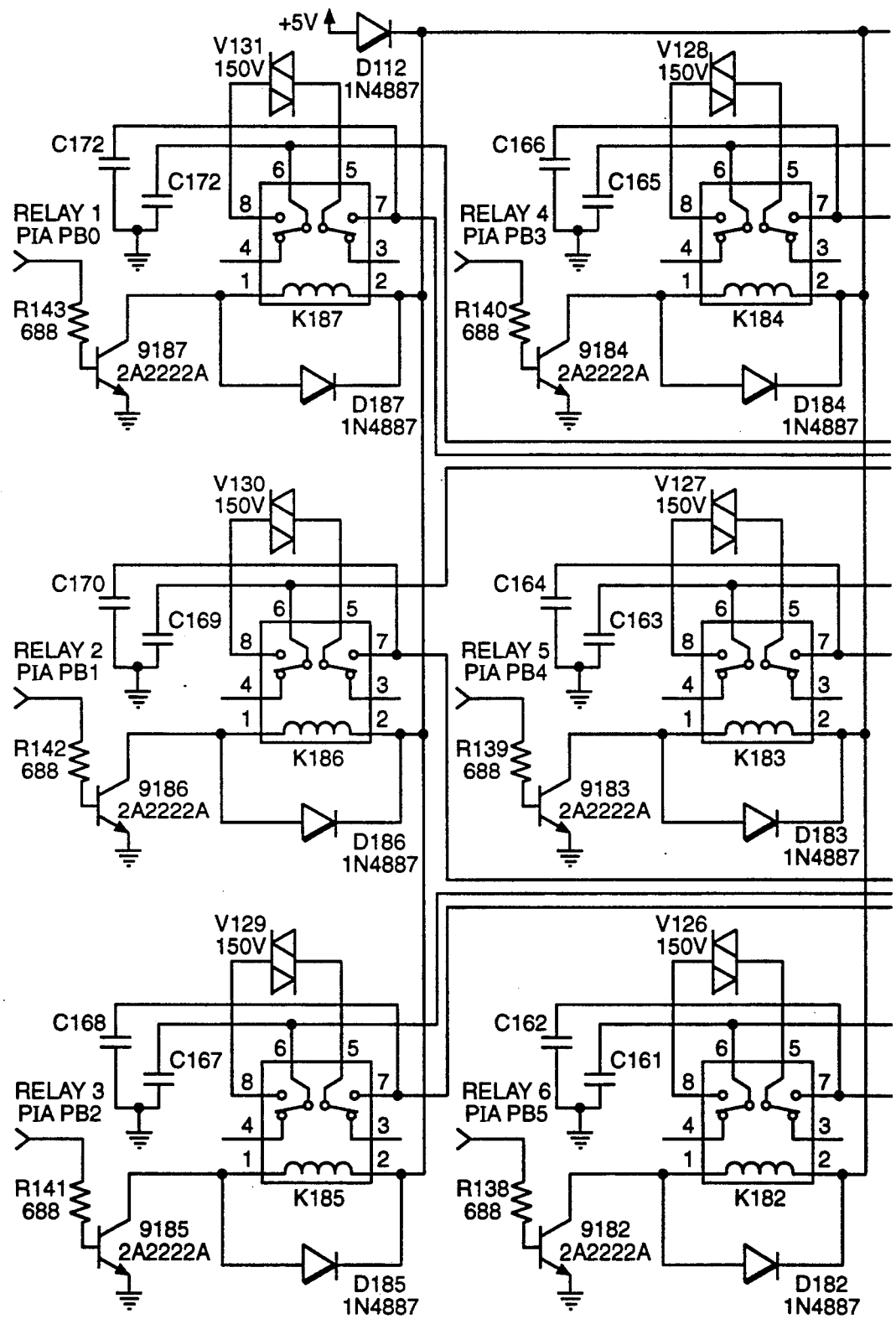
FIG._6E-1

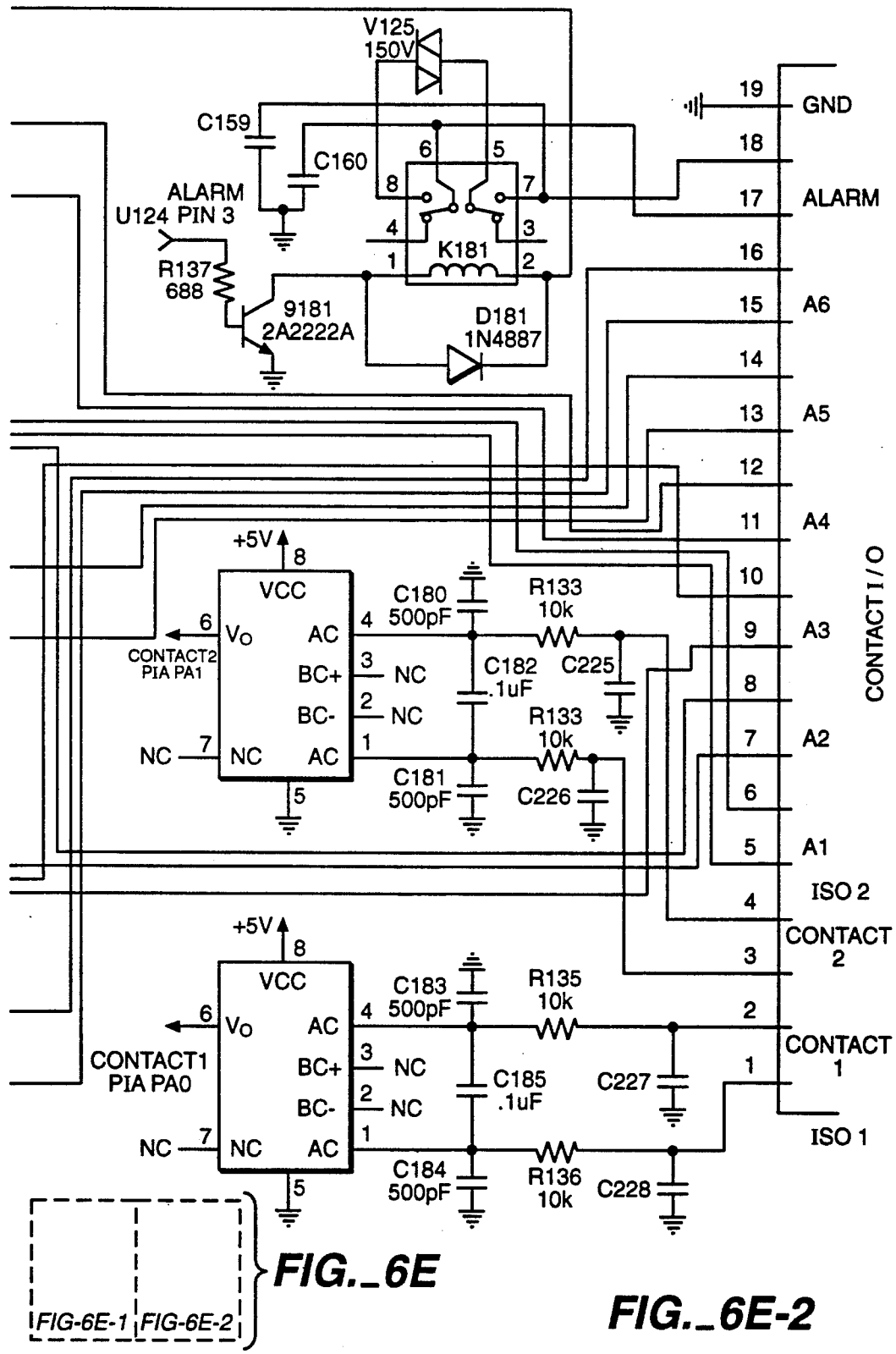
FIG._6E
FIG._6E-2

DISPLAY TRANSDUCER APPARATUS

This is a continuation of application Ser. No. 07/373,040 filed Jun. 28, 1989, now abandoned.

The present invention relates to a display transducer. More particularly, the present invention relates to a display transducer capable of reading data indicative of a power systems performance from a protective relay and intelligently displaying such information in real time in order to monitor and control the power system.

BACKGROUND OF THE INVENTION

In electrical power systems, fault, status and meter data are used to verify proper operation of the power system, control the system, and to detect transmission line faults. The system parameters typically measured are: phase voltages ($V_a$, $V_b$, and $V_c$), phase currents ($I_a$, $I_b$, and $I_c$), line power level ($P_a$, $P_b$, and $P_c$), and reactive power level ($Q_a$, $Q_b$, and $Q_c$). Manual and automatic systems monitor these quantities to control the power system. In the event of a transmission line fault, the experienced operator is required to interpret the monitored information, to trouble shoot the source of the problem, and then take steps to correct it once the source is pinpointed.

A conventional method to provide the aforementioned information is to use a meter, a relay and number of discrete transducers, each of which is capable of providing a particular power system performance measurement. Each transducer requires coupling on-line usually via current or voltage transformers, and provides for converting a power system quantity into particular data for operator display or system control. For example, a voltage transducer is responsible for acquiring line voltage signals from the voltage transformers and converting them into information for display. The meter can be coupled on-line via the instrument transformers to provide voltage, current and power information; alternatively, the meter can monitor transducer output.

A number of problems are associated with using discrete transducers to monitor a power system. The use of discrete devices tends to provide inaccurate monitoring because each device operates at its own reference, and is not standardized with the other transducers. Each transducer's offset may be slightly different than another, and therefore the respective displayed information inherently yields inaccurate results. In addition, each discrete transducer as well as the meter must be individually wired to the power system. This significantly increases the cost, complexity and installation time required to implement a complete monitoring system.

Therefore, an integrated apparatus for acquiring power system information and displaying it as it occurs for transmission line monitoring and verification is needed.

It is therefore an object of the present invention to provide a single unit apparatus which is capable of displaying meter, status and fault information from a protective relay in order to monitor, verify and control operation of the power system.

Another object of the present invention is to provide an apparatus connected to a protective relay so as to have access to a power system's performance parameters wherein the apparatus is capable of alerting system operators of faults, meter information, and relay status conditions visually without requiring expertise in communication with the relay.

Yet another object of the present invention is to provide a display transducer apparatus which connects to a protective digital relay by a single cable and which can produce an analog quantity proportional to system parameters wherein the analog quantity may be selectively scaled to cover a specific range.

SUMMARY OF THE INVENTION

The present invention is directed to an apparatus for connection to a protective relay. The apparatus is capable of digitally communicating with the relay. It obtains watt, voltage, current, reactive power, and fault location information in digitized format from the relay. At least some of this information may be selectively displayed, and the information may be selectively converted from a digitized format into an analog signal. The apparatus includes an output for such an analog signal and the functions of the output are selectable. The apparatus also includes means for selectively scaling the output to cover a specified range.

The apparatus of the present invention provides three primary sets of data: fault (including fault location), meter, and status information. The apparatus provides continuous on-line access to digital relays, and alerts personnel to fault and relay status conditions visually. This capability makes the apparatus ideal for monitoring relay functionality and transmission line parameters. The fault, metering, and status data are available for logging at the press of a button, without requiring operator expertise in communicating with the relay. A broad spectrum of analog data acquisition requirements can be met by the apparatus. Practical benefits of the apparatus include installation simplicity, cost effectiveness, and improved reliability. The apparatus also includes contact inputs and outputs to simplify interfacing to control systems.

BRIEF DESCRIPTION OF THE DRAWINGS

Additional objects and features of the invention will be more readily apparent from the following detailed description and claims when taken in conjunction with the drawings, in which:

FIG. 1 is a schematic, block diagram representation of the display transducer adapter of the present invention connected to a digital relay which is, in turn, connected to a three phase power system.

FIG. 2 is a view of the rear input panel of the display transducer adapter of the present invention.

FIG. 3 is a graphic representation of the scaling of the analog outputs of the display transducer adapter of the present invention.

FIG. 4 is a block diagram representation of the circuitry of the display transducer adapter of the present invention.

FIG. 5 is a view of the front display panel of the display transducer adapter of the present invention.

FIGS. 6A–6E are electrical schematic diagrams illustrating circuitry of the display transducer adapter of the present invention.

DESCRIPTION OF THE PREFERRED EMBODIMENT

Reference is initially made to FIG. 1 which shows a display transducer adapter (DTA) 30, a digital relay 32, a two way communication bus 34, and a three phase power system 36 (lines A, B, C). The DTA 30 is electrically coupled by the communication bus 34, which may be a single electrical cable, to digital relay 32. The relay, in turn, is connected across the lines of three phase power system 36. The DTA 30 provides access to the following relay data: fault, meter, and status information. New faults are captured, stored and displayed by DTA 30 as they occur. Meter information is displayed and continuously updated on demand. Relay self-test failures and other status warnings are automatically displayed with a visual alert, and status information is displayed on demand for logging purposes. This blend of display features permits both transmission line monitoring and verification and relay system functionality at a glance.

The information available from DTA 30 may be displayed automatically or in response to a user request via switches on the front panel of the DTA (see FIG. 5). Some user requests for data require on demand information from relay 32. If the user requests meter data by pressing the appropriate switch on the front panel of the DTA, the DTA requests the data from the relay by sending an appropriate character string, such as METER <CR>, to the relay via the communications link 34 between the DTA and the relay. The requested information is formatted and stored as it is delivered by the relay, and then displayed when complete, as will be discussed in more detail below. Indeed, all fault, meter and status information from the relay are parsed, categorized and stored by DTA 30 as they are generated. These data are then formatted, scaled and delivered to the display, transducer outputs and/or contact outputs of DTA 30, as discussed below.

As shown in FIG. 2, the rear input panel of DTA 30 includes: three serial or communication ports 40, 41 and 42 (Port 1, Port 2 and Port 2A); an analog output 43; six type A relay contacts A1-A6; a type B relay contact for an alarm (ALRM); and two programmable isolator inputs ISO1 and ISO2.

The communications ports provide RS-232-C serial communications interfaces (nine-pin connectors). The serial data format is: 8 data bits, 2 stop bits and no parity. As is known in the art, the baud rates of the ports are set with jumpers which are accessible by removing the top cover (not shown) of DTA 30. Available rates are: 300, 600, 1200, 2400, 4800, and 9600.

Communications port 40 (Port 1) may be connected to a computer terminal, a CRT and/or modem for changing the analog output scaling and other DTA settings. Port 41 (Port 2) provides links to the relay for communications and D.C. power. It should be connected to the relay automatic message port. Port 42 (Port 2A) may be connected to port 41 via a null modem, and may be utilized for monitoring of port 41 and alternate power supply configurations.

In a local arrangement, all power requirements for DTA 30 are supplied from the relay via a single cable 34. The length of this cable thus must be kept at a minimum. For example, for a wire gauge (AWG) of 18, the maximum cable length is 18 feet. Chart A below provides the maximum cable length for various wire gauges.

CHART A

| Wire Size (AWG) | Maximum Cable Length (FEET) |
| --- | --- |
| 18 | 18 |
| 20 | 11 |
| 22 | 7.0 |

CHART A-continued

| Wire Size (AWG) | Maximum Cable Length (FEET) |
| --- | --- |
| 24 | 4.5 |

If DTA 30 must be located at a distance from relay 32, the DTA may be powered by a supplemental power supply via communications port 41, and links to the relay for data are then provided via port 42. Since power is not being drawn from the relay, the cabling to the relay may be quite long, and, indeed, it may be further extended using, for example, a short-haul modem or similar isolating device.

DTA 30 is equipped with eight programmable transducer channels at which an analog output signal is available. These signals are available from the rear panel at analog output 43 in voltage (0-5 v) and current (0-1 mA) form. A separate return to ground is also provided for each channel. These signals may be presented at the rear panel through a female 25-pin "D" connector. For systems requiring screw terminal connections, an optional adapter board may be used, which breaks a female 25-pin "D" connector out into screw terminals. The signals at analog output 43 are assigned pin numbers as shown in Chart B.

CHART B

| SIGNAL DESCRIPTION | PIN NUMBER |
| --- | --- |
| Voltage output 1 | 13 |
| Ground 1 | 25 |
| Current output 1 | 12 |
| Voltage output 2 | 11 |
| Ground 2 | 24 |
| Current output 2 | 10 |
| Voltage output 3 | 9 |
| Ground 3 | 23 |
| Current output 3 | 8 |
| Voltage output 4 | 7 |
| Ground 4 | 22 |
| Current output 4 | 6 |
| Voltage output 5 | 5 |
| Ground 5 | 21 |
| Current output 5 | 4 |
| Voltage output 6 | 3 |
| Ground 6 | 20 |
| Current output 6 | 2 |
| Voltage output 7 | 1 |
| Ground 7 | 19 |
| Current output 7 | 14 |
| Voltage output 8 | 15 |
| Ground 8 | 18 |
| Current output 8 | 16 |

Each analog output channel may be preferentially selected by the user as to function, i.e. as to which system parameter is available at which channel. As such, each channel may be selected to be proportional to one of the following: phase-to-phase voltage, phase-to-neutral voltage, phase current, phase-to-phase current, real power, reactive power, or fault location. All permutations of phase quantities are supported. The ranges of all output channels are also independently selectable by the user. The analog outputs are scaled as shown in FIG. 3 where X is any phase, phase-to-phase, or phase-to-neutral quantity, real or reactive power, or fault location. As noted, the dedication of transducer channels to meter quantities and the scaled range are user settable parameters. The versatility afforded by the features allows utilization of the DTA in a wide range of data acquisition and metering applications, reducing or eliminating entirely the need for discrete transducers.

The outputs of the six type A relay contacts A1–A6 indicate fault conditions and acknowledge reset commands. The additional type B relay contact ALRM is provided to indicate a self-test failure or other alarm condition. All contact outputs are dedicated and are not programmable. The contact assignments and signal descriptions are as shown in Chart C:

CHART C

| Relay Contact | Terminal Block Positions | Signal | Description |
|---|---|---|---|
| A1 | 5,6 | A | The current fault involves phase A |
| A2 | 7,8 | B | The current fault involves phase B |
| A3 | 9,10 | C | The current fault involves phase C |
| A4 | 11,12 | G | The current fault involves ground |
| A5 | 13,14 | FAULT | A fault has occurred |
| A6 | 15,16 | RST ACK | All fault-related analog and contact outputs are reset |
| ALRM | 17,18 | ALARM | An alarm condition exists |

Relay contacts A1–A5 reflect new fault information. Contact outputs A1–A4 indicate the involved phases, and contact A5 indicates that at least one phase is involved. Contacts A1–A5 open in response to either of two conditions:

(1) An assertion of the RESET isolator input (discussed below) clears contacts A1–A5 immediately, and causes contact A6 (RST ACK) output to be triggered. The RST ACK signal is valuable for interfacing to instruments requiring verification of proper device operation.

(2) If, after a suitable interval, no RESET input assertion is detected, contacts A1–A5 reset automatically, and the RST ACK output is triggered.

A suitable time interval (LOCK) controls updating of contact outputs A1–A5 and any analog outputs dedicated to fault location. During LOCK seconds after a fault, the outputs are not affected by subsequent faults. This feature may be used to avoid replacement of accurate fault information by less accurate data (as may occur during reclosing operations). When triggered, the RST ACK output closes for one minute. During this interval, the output is retriggerable, and remains closed for one minute after the most recent retriggering.

The programmable isolator inputs ISO1 and ISO2 are provided for control of transducer and contact output data from a remote system. ISO1, the RESET input, clears any analog channels set to indicate fault location, and clears contact outputs A1–A5. After the output quantities are cleared, the RST ACK contact output A6 is triggered. This input is rising-edge sensitive. ISO2 may be reserved for future applications.

The main components of the circuitry of DTA 30 is shown in FIG. 4 in block diagram format. As discussed above, they include: serial ports 40–42, contact inputs ISO1 and ISO2, analog outputs 43, and relay outputs A1–A6 and ALRM. A display module 52 (see also FIG. 5) is provided for the display of information. A microprocessor, such as a Motorola MC6809, controls the operation of DTA 30. The circuitry also includes a random-access memory (RAM) 46, a read-only memory (ROM) 47, and an electrically-erasable programmable ROM (EEPROM) 48. The RAM 46 retains variables used in data processing and computations, while ROM 47 stores the program executed by the microprocessor. EEPROM 48 is utilized to save settings such as those listed in Appendix A, discussed below. The data from the digital relay are read, parsed, categorized, stored, formatted, scaled, and delivered, according to the program stored in ROM 47 while those data are being held in RAM 46. Settings saved in EEPROM 48 effect the scaling and other functions as shown in Appendix A.

Referring now to FIG. 5, the front panel 50 is arranged to provide the system operator with: fault, meter, and status information on demand. The front panel 50 includes: a liquid crystal display 52 for displaying information; a scroll down button 53 and a scroll up button 54 for scrolling up and down the information displayed on display 52; a fault select switch 55 for displaying fault information on display 52; a meter select switch 56 for displaying meter information on display 52; and a status select switch 58 for displaying status information on display 52. In addition, a clear select switch 60 is provided to clear the information displayed on display 52.

Display 52 is preferably a two-line, forty column, high contrast display. As noted, display modes and scrolling are controlled with the front panel switches. A switch is asserted by toggling upward until it clicks. The "scroll" switches 53 and 54 repeat if held in the asserted state. Faults, meter and status information displays are described below.

The FAULTS mode, i.e. display of fault information, may be entered in two ways: (1) pressing the faults switch 55; or (2) new faults reported by the relay 32 preempt all other display modes and place DTA 30 in the FAULTS mode. Assertion of faults switch 55 allows viewing of the latest thirty validated faults as reported to DTA 30 by relay 32. The most recent two faults are the first displayed. If no faults have been captured since power up, the message "FAULT HISTORY EMPTY" is displayed.

Faults are numbered sequentially from the newest to the oldest; the most recent fault is assigned the number "1", with previous faults discarded as the fault history exceeds thirty lines in length. The contents of the display are determined by the position of the display window 57 within the thirty fault history. Chart D below illustrates an example fault history, with the display window positioned to include the two most recent faults (as if the mode was just recently entered). As shown by Chart D, the display shows for each fault: the fault number (01), the date (01/02/88) and time (22:31:51.812) of the fault, the type of fault (1BG (line B to ground)), and the fault location (74.58 (miles)).

CHART D

| BEGINNING OF HISTORY | | | | | |
|---|---|---|---|---|---|
| 01 | 01/02/88 | 22:33:51.812 | 1BG | 74.58 | DISPLAYED DATA |
| 02 | 01/02/88 | 22:33:47.108 | 1AG | 74.43 | |
| 03 | 01/02/88 | 10:23:10.678 | 1CG | 94.45 | |
| 04 | 01/02/88 | 10:11:23.498 | 1BG | 106.22 | STORED DATA |
| 29 | 01/01/88 | 13:44:67.893 | 1AG | 70.29 | |
| 30 | 01/01/88 | 02:22:15.375 | 1AG | 76.78 | |
| END OF HISTORY | | | | | |

A single assertion of the scroll down switch 53 changes the display window position. Thus, pressing scroll down switch 53 will cause the information pertaining to faults 2 and 3 to be displayed. Any two faults in the thirty fault history may be viewed using the "scroll up" and "scroll down" switches 53 and 54 in this manner.

When a fault report is sent to DTA 30 from relay 32, it is first checked against a settable fault location window (see the below discussion of the SET command). If the fault lies within the window, the currently active display mode is preempted, and the DTA enters the FAULT's mode automatically. DTA 30 indicates the receipt of the new fault by annexing the line "NEW FAULT" to the top of the fault list in blinking characters, and the information pertaining to that fault is displayed.

If any transducer outputs (analog output 43) are programmed to present the faults location, these channels will be updated according to the rules outlined below in the discussion of the SET command. The contact outputs A1–A6 also reflect fault information.

Pressing any active front-panel control acknowledges the fault, after which the faults mode functions as previously described. If both new fault(s) and relay status warnings exist and are acknowledged, the new fault line is modified to read: "NEW FAULT RELAY STATUS WARNING".

The DTA 30 remains in the FAULTS mode of operation until another display mode is selected. Also, if all new faults have been acknowledged, the FAULTS mode may be preempted by the status mode via detection of a relay status warning.

The METER mode, i.e. display of meter information, is activated by assertion of the meter switch 56. In this mode of operation, display 52 contains the information shown in Chart E.

CHART E

| V: | 233.1 | 232.8 | 232.9 | P: | 350.9 |
|---|---|---|---|---|---|
| I: | 994.0 | 995.0 | 994.0 | Q: | 67.8 |

As shown, the top display line contains the letter "V", indicating that the next three display fields contain voltage data. The first field accommodates the rms voltage Vab (233.1), the second field contains the rms voltage Vbc (232.8), and the third field shows the rms voltage Vca (232.9). The top display line also contains the letter "P", identifying the final field as real power (350.9). The bottom display line contains the letter "I", indicating that the next three display fields contain current data. The first field accommodates the rms current Ia (994.0); the second field contains the rms current Ib (995.0); the third field shows the rms current Ic (994.0). The bottom display also contains the letter "Q" for displaying the reactive power (67.8).

The DTA 30 remains in the METER mode of operation until a new fault is reported. The mode is exited manually by assertion of clear switch 60, or another display mode is activated by assertion of the corresponding control. Additionally, the METER mode may be preempted by the STATUS mode via detection of a relay status warning. The scroll controls 53 and 54 are not operative while in the METER mode.

While in the METER mode, display 52 will be updated with new data approximately every five seconds. The analog output channels 43 (FIG. 2) are continuously updated about every five seconds, regardless of display mode.

The STATUS mode, display of status information, may be entered in two ways: (1) pressing the status control 58; or (2) detection of a relay status warning may preempt certain modes in favor of the STATUS mode under appropriate conditions.

When status switch 58 is pressed, the status of the relay is interrogated and the received status message is displayed as shown in Chart F. The scroll controls 53 and 54 may be used to view any two lines of the message.

CHART F

| DATE: 01/04/87 | TIME: 08:50:30 |
|---|---|
| OFFSET IP = 0 mV | |

Upon receipt of a relay status report, DTA 30 determines if the immediate mode may be preempted in its current state. If so, the STATUS mode is entered, with the line "RELAY STATUS WARNING" in blinking characters annexed to the beginning of the message. Assertion of any operative front-panel control acknowledges the condition, after which the STATUS mode functions as previously defined.

The STATUS mode is exited automatically when a fault report is received, and may be exited manually by pressing the "clear", "meter", or "faults" switches 60, 56 or 55.

The STANDBY mode may be entered by pressing clear switch 60, and may be identified by the following display message: "SEL-DTA DISPLAY/TRANSDUCER ADAPTER".

The DTA 30 remains in this mode until (1) an active display mode is selected by assertion of an operative front-panel switch; (2) a relay status message is received; or (3) a fault is reported to the DTA by the relay. While in this mode, only the "faults", "meter", "status", and "clear" switches 55, 56, 58, and 60 are operative.

The function of clear switch 60 depends upon the mode of the DTA. If the DTA is in any mode other than STANDBY, the mode is changed to STANDBY. If the DTA is already in STANDBY mode, the following operations occur: (1) the display module is tested for proper operation; if this test fails, an automatic status message is sent to port 40 (see FIG. 2); (2) while asserted, all elements of the display are actuated, allowing visual verification of proper display operation; and (3) upon release, the display is cleared and the DTA is returned to the STANDBY mode of operation.

DTA 30 also runs an assortment of self-tests that ensure reliable operation. Any change in self-test status results in the generation of a status report. All self-tests are run on power-up and after using the setting procedure. Afterwards, all self-tests except the display test are run at least every few minutes.

The RAM 46 (see FIG. 4) is periodically checked to ensure that each byte can be written to and read from correctly. There is no warning state for this test. If a problem is detected, a STATUS message is transmitted to port 40 which contains the socket designation of the affected RAM IC. ROM 47 is periodically tested by computing a checksum. If the computed value does not agree with the stored value, a ROM failure is declared. The STATUS message is also transmitted to port 40. Two images of the system settings are stored in nonvolatile memory. These are compared when the DTA is initially set, and periodically thereafter. Should the images ever disagree, the setting test fails and a STATUS message is transmitted to port 40. The display module 52 is tested when the instrument is powered up, and as described in the discussion of the STANDBY mode. If a display module failure is detected, the DTA sends an automatic status message to port 40.

Protocol and Commands

The communications protocol utilizes both hardware and software attributes. The hardware protocol is implemented in the control line functions RTS and CTS. A software protocol designed for manual and automatic communications is also provided. The elements of this protocol are discussed below. All commands received by DTA 30 must be of the form: <command><CR> or <command><CRLF>. Thus, a command transmitted to DTA 30 should consist of the command name, followed by either a carriage return or a carriage return and a line feed. (To use any command, only the first three characters need to be typed. Character case is not relevant.) All messages transmitted by DTA 30 are of the following format:

```
<STX><MESSAGE LINE 1><CRLF>
    <MESSAGE LINE 2><CRLF>
    .
    .
    .
<LAST MESSAGE LINE><CRLF><PROMPT><ETX>
```

That is, each message begins with the start-of-transmission character (ASCII 02), and ends with the end-of-transmission character (ASCII 03), and each line of the transmission is terminated by a carriage return and a line feed.

DTA 30 indicates the volume of data in its receive-data buffer (part of RAM 46) using an XON/XOFF protocol. When this buffer drops below ¼ full, the DTA 30 transmits XON (ASCII hex 11) and asserts the RTS output. When the buffer fills above ¾ of capacity, the DTA transmits XOFF (ASCII hex 13). If the buffer reaches 95% full, the DTA unasserts the RTS output. Transmitting sources should monitor for the XOFF character to prevent overwriting of the DTA input buffer (part of RAM 46). Transmission should terminate at the end of the message being transmitted when XOFF is received and may be resumed when the XON character is received.

An XON/XOFF procedure may be used to control data transmission by DTA 30. When the DTA receives XOFF while transmitting, it responds by pausing until an XON character is received. If no message is being transmitted when XOFF is received, the DTA blocks transmission of any message that may be presented to its transmitting buffer (part of RAM 46). The message will be transmitted when the XON character is received. The CAN character (ASCII hex 18), received at any time, aborts a pending transmission. This is useful in terminating an unwanted transmission. The control characters can be sent from most keyboards using the following keystrokes:

XON: control-Q (hold down the control key, and press Q)
XOFF: control-S (hold down the control key, and press S)
CAN: control-X (hold down the control key, and press X)

When the power is first turned on, the DTA 30 is in Access Level 0, and honors only the ACCESS command. "Invalid command" or "Invalid access level" are the responses to any other entries. All commands except those that change settings are available at Access Level 1. Setting changes may be made only at Access Level 2. When power is first applied, the instrument transmits the following message to port 40: "SEL-DTA Display/Transducer Adapter Date: mm/dd/yy Time: hh/mm/ss SEL-DTA". Commands consist of three or more characters. Only the first three characters of any command need be entered. Character case is not relevant for commands. For passwords, however, case is important. Items in square brackets [. . .] are optional. Arguments must be separated from the command by spaces, commas, semicolons, colons, or slashes. Commands may be entered any time after an appropriate prompt is received. Commands are entered through port 40 (See FIG. 2), to set the DTA. A computer terminal need not remain connected to the port. The commands available at various access levels are discussed below.

Access Level 0

Access

ACCESS is used to gain access to the system. The DTA 30 prompts for a Level 1 password before granting access. If three unsuccessful password entry attempts are made in a row, the alarm contact is pulsed closed for one second. If the alarm is connected to a monitoring system, such as Substation System Control and Data Acquisition ("SCADA"), this feature can be used to alert operations personnel that possible unauthorized access is being attempted.

Access Level 1

2Access

Use 2ACCESS to gain access to Level 2 from Level 1. After entering 2ACCESS<CR>, a prompt for the Level 2 password appears. The alarm contact is pulsed closed for one second for any Level 2 access attempt, successful or otherwise.

Date [mm/dd/vv1

To read the date kept by the internal calendar/clock, type DATE<CR>. To set the date, type DATE mm/dd/yy <CR>.

Ouit

Executing the QUIT command returns control to Access Level 0 from either Access Level 1 or 2, and displays the instrument identification, and the date and time when QUIT is executed. This command is utilized when communications with DTA 30 are completed, so that unauthorized access is avoided.

Showset

Enter SHOWSET to inspect the settings of the DTA. The commands display shows the settings presently set. The settings cannot be modified with this command. The settings are entered using the SET command under Access Level 2.

Status

Inspect the self-test status of the DTA using the STATUS command. The DTA also automatically executes the STATUS command whenever a self-test enters a warning or a failure state, causing the STATUS report to be transmitted out of serial communications port 40.

Time hh:mm:ss1

To read the internal clock enter TIME <CR>. To set the clock enter TIME followed by the desired setting. A quartz crystal oscillator provides the time base for the internal clock.

Access Level 2

Password (1 or 2) [password]

To inspect the passwords, enter PASSWORD <CR>. To change a password, provide the access level and new password.

Set

The setting procedure consists of answering prompting messages with new data, or indicating no change by simply responding with <CR>. Once all data are provided, the new settings are displayed, and a prompt issued requesting approval to enable DTA 30 with the new settings. Error messages indicate when the entered data are out of range. An example SET command display follows and is shown in attached Appendix A.

The TIME1 setting controls the timeout interval of communications port 40 (see FIG. 2). LOCK specifies the time after a fault during which analog and contact output changes will be suppressed. If, for example, a fault was immediately followed by two reclose faults within 4.167 seconds, only the first fault would affect the analog and contact outputs (given the example LOCK setting of 1000 quarter cycles). The RESET setting controls the amount of time after a fault at which the analog and contact outputs will automatically reset. The example setting tells DTA 30 to wait for two minutes before resetting the outputs. A setting of 0 specifies no automatic reset.

Settings MINW and MAXW specify the fault location window. Faults with locations outside this window will be ignored by DTA 30. For example settings, a fault with a location of 75.34 miles would be captured, stored, displayed, and presented at the contact and analog outputs. A reverse fault with location −34.45 miles would not be processed by the DTA; all outputs would be unaffected.

Settings QUA1-QUA8 control the class of data appearing at the transducer outputs. Available quantities are voltages, currents, watts, vars, and fault location. In the example setting (see Appendix A), QUA1 is set to "VAB", indicating that transducer channel 1 will reflect the voltage as measured from phase A to phase B.

Settings MIN1-MIN8 and MAX1-MAX8 reflect the measured quantities corresponding to 0 V (0 mA) and 5 V (1 mA), respectively. Values falling within the set range for a channel are scaled according to the equations:

$$V_{out} = \frac{\text{MEASURED QUANTITY} - \text{MIN}}{\text{MAX} - \text{MIN}} \times 5 \text{ V}$$

$$I_{out} = \frac{\text{MEASURED QUANTITY} - \text{MIN}}{\text{MAX} - \text{MIN}} \times 1 \text{ mA}$$

For example, using the example settings and a measured value VAB of 231.2 kV, the output quantities for analog channel 1 would be:

$$V_{out1} = \frac{231.2 - 0.0}{500 - 0.0} \times 5 \text{ V}$$

$$I_{out1} = \frac{231.2 - 0.0}{500 - 0.0} \times 1 \text{ mA}$$
$$= 462.4 \text{ uA}.$$

An electrical schematic diagram of circuitry that may be utilized in DTA 30 is illustrated in FIGS. 6A–6E. As shown in FIG. 6A, the circuitry includes microprocessor 45 (see also FIG. 4) connected in circuit with RAM 46, ROM 47 and EEPROM 48. As shown, the RAM 46 may be implemented by means of high and low RAMS, and the ROM 47 by an EPROM. These circuit elements parse, categorize and store the fault, meter and status information received from relay 32. This information is also available for display at display module 52 (see also FIG. 5). As noted, quartz crystal oscillator 62 provides the time base.

As shown in FIG. 6B, communication to the circuitry from, e.g. a computer terminal, is provided by means of Port 1 (see also FIG. 2). And as also discussed, Port 2 provides links to relay 32 for communications and power. Port 2A provides the link to relay 32 if a supplemental power supply is required. Low-energy, low voltage metal oxide varistors (MOVs) 64 and passive RC filters 66 are provided to protect the communication circuits. Switches S1–S6 correspond to switches 53–56, 58 and 60 on the front panel of DTA 30 (see FIG. 5).

FIGS. 6C and 6D illustrate the analog output 43. A digital-to-analog converter 68 is included in this portion of the circuitry for converting the digitized information into analog signals. The SET command is provided for programming or selecting the particular function or parameter available at a selected analog output or channel. The ranges of these outputs may be selectively set by this method. The SET command is part of the program stored in ROM 47. When the operator uses the SET command, microprocessor 45 accepts his configuration for the accepted quantities and ranges, and stores them in EEPROM 48. A surge network 70 (FIG. 6D) is provided for protecting the circuit elements.

FIG. 6E shows relay contacts A1–A6 and ALRM (see also FIG. 2). Isolator inputs ISO1 and ISO2 are also shown.

DTA 30 offers a simple and economical on-line interface to a protective relay. Additionally, the programmable current and voltage transducers (analog outputs) permit integration of data acquisition and relaying capabilities, resulting in substantial cost and complexity savings over discrete systems employing conventional transducers. As discussed, new fault information and analog channel control are provided via relay contact outputs and isolator inputs, allowing easy interface to power system monitoring control equipment, such as SCADA systems. Additionally, for most applications, a single cable connection to the relay serial port satisfies all power and data requirements.

Although certain embodiments of the invention have been described herein in detail, the invention is not to be limited only to such embodiments, but rather only by the appended claims.

APPENDIX A
EXAMPLE SET COMMAND DISPLAY

```
=>>set
CTRL-X cancels.
Enter data, or RETURN for no change
ID:      SEL-DTA Display/Transducer Adapter       PERMISSIBLE RANGE
?                                                 <lower,upper;step>
TIME1:   Port 1 timeout (min) =    0       ?      <0,30;1>
LOCK:    Output lockout (q.c.) =   1000    ?      <0,8000;1>
RESET:   Output timeout (min) =    2       ?      <0,600;1>
MINW:    Min Fault Window =        -10.0   ?      <-100000,100000>
MAXW:    Max Fault Window =        100.0   ?      <-100000,100000>
Analogs  (VA, VB, VC, VAB, VBC,
         VCA, IA, IB, IC, IAB, IBC,
         ICA, P, Q, FL)
QUA1:    Measured quantity =       VAB     ?      <VA,FL>
MIN1:    Min Range =               0.0     ?      <-100000,100000>
MAX1:    Max Range =               500.0   ?      <-100000,100000>
QUA2:    Measured quantity =       IA      ?      <VA,FL>
MIN2:    Min Range =               0.0     ?      <-100000,100000>
MAX2:    Max Range =               1200.0  ?      <-100000,100000>
QUA3:    Measured quantity =       IB      ?      <VA,FL>
MIN3:    Min Range =               0.0     ?      <-100000,100000>
MAX3:    Max Range =               1200.0  ?      <-100000,100000>
QUA4:    Measured quantity =       IC      ?      <VA,FL>
MIN4:    Min Range =               0.0     ?      <-100000,100000>
MAX4:    Max Range =               1200.0  ?      <-100000,100000>
QUA5:    Measured quantity =       P       ?      <VA,FL>
MIN5:    Min Range =               0.0     ?      <-100000,100000>
MAX5:    Max Range =               -200.0  ?      <-100000,100000>
QUA6:    Measured quantity =       P       ?      <VA,FL>
MIN6:    Min Range =               0.0     ?      <-100000,100000>
MAX6:    Max Range =               200.0   ?      <-100000,100000>
QUA7:    Measured quantity =       Q       ?      <VA,FL>
MIN7:    Min Range =               200.0   ?      <-100000,100000>
MAX7:    Max Range =               -200.0  ?      <-100000,100000>
QUA8:    Measured quantity =       FL      ?      <VA,FL>
MIN8:    Min Range =               0.0     ?      <-100000,100000>
MAX8:    Max Range =               100.0   ?      <-100000,100000>
New settings for: SEL-DTA Display/Transducer Adapter
TIME1 =   0        LOCK =   1000    RESET =   2
MINW  =   -10.0    MAXW =   100.0
QUA1  =   VAB      MIN1 =   0.0     MAX1 =    500.0
QUA2  =   IA       MIN2 =   0.0     MAX2 =    1200.0
QUA3  =   IB       MIN3 =   0.0     MAX3 =    1200.0
QUA4  =   IC       MIN4 =   0.0     MAX4 =    1200.0
QUA5  =   P        MIN5 =   0.0     MAX5 =    200.0
QUA6  =   P        MIN6 =   0.0     MAX6 =    -200.0
QUA7  =   Q        MIN7 =   -200.0  MAX7 =    200.0
QUA8  =   FL       MIN8 =   0.0     MAX8 =    100.0
OK (Y/N) ? y
```

What is claimed is:

1. An apparatus for connection to a digital protective relay connected to a power system, comprising:
    means for providing digital communication between the relay and the apparatus;
    means for obtaining power system information in digitized format from the relay;
    means for selectively displaying at least some of the power system information obtained from the relay wherein the power system information includes fault location information and said obtaining means provides for storing information for a plurality of discrete faults which fault information may be displayed by said displaying means;
    means for selectively converting the digitized information into at least one analog signal and providing an output for said signal, the information represented by said signal being preferentially selectably by a user of the apparatus; and
    serial communication means for communicating with the relay so the apparatus may be located near or at a distance from the relay.

2. The apparatus of claim 1 further including means for selectively scaling said signal to cover a specified range.

3. The apparatus of claim 1 wherein the power system information further includes phase, phase-to-phase and phase-to-neutral quantities, and real and reactive power information.

4. An apparatus for connection to a digital protective relay connected to a power system, comprising:
    means for providing digital communication between the relay and the apparatus;
    means for obtaining power system information in digitized format from the relay;
    means for selectively converting the digitized information into at least one analog signal and providing an output for said signal;
    relay contact outputs for signaling fault type; and
    means for interfacing the apparatus with control equipment for the power system whereby signals from said analog output and said relay contact outputs are provided to said control equipment to control the operation of the power system.

5. The apparatus of claim 4 further including means for selectively scaling said signal to cover a specified range.

6. The apparatus of claim 4 wherein said power system information includes phase, phase-to-phase and phase-to-neutral quantities, real and reactive power, and fault location information.

7. The apparatus of claim 4 wherein a display means selectively displays fault, meter and status information.

8. An apparatus for connection to a protective relay, comprising:
   means for providing digital communication between the relay and the apparatus;
   means for obtaining watt, voltage, current, reactive power, and fault location information in digitized format from the relay;
   means for selectively displaying at least some of the information obtained from the relay;
   means for converting the digitized information into analog signals and providing an output for said signals wherein the information represented by said signals is selectable;
   means for selectively scaling said signals to cover a specified range;
   serial communication means for communicating with the relay so the apparatus may be located near or at a distance from the relay;
   relay contact outputs for signaling fault type; and
   isolator input means for controlling at least one analog output and said relay contact outputs.

9. The apparatus of claim 8 wherein said digital communication means includes a single electrical cable connected between the apparatus and the relay.

10. The apparatus of claim 8 wherein said analog signals are proportional to at least one of: phase-to-phase voltage, phase-to-neutral voltage, phase current, phase-to-phase current, real power, reactive power, or fault location.

11. The apparatus of claim 10 wherein there are eight analog outputs.

12. The apparatus of claim 10 wherein said analog signals are at levels of between 0 and 5 volts or 0 and 1 milli-amp.

13. The apparatus of claim 8 wherein selected ones of said relay contact outputs reflect new fault information and the involved phases of the power system.

14. The apparatus of claim 8 wherein there are six of said relay contact outputs.

15. The apparatus of claim 8 wherein said display means selectively displays fault, meter and status information.

16. The apparatus of claim 15 wherein said display means is capable of displaying phase, phase-to-phase and phase-to-neutral quantities, real and reactive power, and fault location.

* * * * *